United States Patent
Kim et al.

(10) Patent No.: US 10,571,523 B2
(45) Date of Patent: Feb. 25, 2020

(54) WIRELESS BATTERY MANAGEMENT SYSTEM AND BATTERY PACK INCLUDING SAME

(71) Applicant: LG CHEM, LTD., Seoul (KR)

(72) Inventors: Ji-Eun Kim, Daejeon (KR); Sang-Hoon Lee, Daejeon (KR); Yean-Sik Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/333,268

(22) PCT Filed: Jun. 19, 2018

(86) PCT No.: PCT/KR2018/006913
§ 371 (c)(1),
(2) Date: Mar. 14, 2019

(87) PCT Pub. No.: WO2019/017596
PCT Pub. Date: Jan. 24, 2019

(65) Prior Publication Data
US 2019/0265304 A1    Aug. 29, 2019

(30) Foreign Application Priority Data
Jul. 20, 2017 (KR) .................. 10-2017-0092151

(51) Int. Cl.
*G01R 31/36* (2019.01)
*G01R 31/382* (2019.01)
(Continued)

(52) U.S. Cl.
CPC .......... *G01R 31/3648* (2013.01); *B60L 50/50* (2019.02); *G01R 31/382* (2019.01);
(Continued)

(58) Field of Classification Search
None
See application file for complete search history.

(56) References Cited

U.S. PATENT DOCUMENTS 7,598,880 B2 * 10/2009 Powell .............. G01R 31/3648
340/636.1
7,774,151 B2 * 8/2010 Bertness ............ G01R 31/3648
702/63
(Continued)

FOREIGN PATENT DOCUMENTS

KR    2006-506787 A    2/2006
KR    10-0852060 B1    8/2008
(Continued)

OTHER PUBLICATIONS

International Search Report (PCT/ISA/210) issued in PCT/KR2018/006913, dated Oct. 4, 2018.
(Continued)

*Primary Examiner* — Fekadeselassie Girma
(74) *Attorney, Agent, or Firm* — Birch, Stewart, Kolasch & Birch, LLP (57) ABSTRACT

A wireless battery management system and a battery pack which includes a master BMS configured to transmit a first radio frequency (RF) signal including a state detection command through a first wireless channel, and a plurality of slave BMSs coupled to a plurality of battery modules in one-to-one correspondence. Each of the plurality of slave BMSs is configured to detect state information of the battery module in which corresponding slave BMS is coupled in response to the first RF signal, and transmit a second RF signal indicating the state information of the battery module through the first wireless channel.

8 Claims, 8 Drawing Sheets

(51) Int. Cl.
*H01M 10/48* (2006.01)
*H02J 7/00* (2006.01)
*H01M 10/42* (2006.01)
*B60L 50/50* (2019.01)

(52) U.S. Cl.
CPC ......... *H01M 10/42* (2013.01); *H01M 10/482* (2013.01); *H02J 7/00* (2013.01); *H02J 7/0047* (2013.01)

(56) References Cited

U.S. PATENT DOCUMENTS

| | | | |
|---|---|---|---|
| 8,350,529 B2 | 1/2013 | Loncarevic | |
| 8,563,152 B2* | 10/2013 | Morita | H01M 10/4207 |
| | | | 429/93 |
| 9,142,980 B2 | 9/2015 | Lee | |
| 9,203,118 B2* | 12/2015 | Lenz | H01M 10/6551 |
| 9,293,935 B2* | 3/2016 | Lee | H01M 10/4207 |
| 10,101,398 B2* | 10/2018 | Yoshino | G01R 31/3648 |
| 2006/0152190 A1 | 7/2006 | Riemschneider | |
| 2013/0320768 A1* | 12/2013 | Fujimatsu | H02J 1/00 |
| | | | 307/77 |
| 2014/0035365 A1 | 2/2014 | Yoo | |
| 2014/0266062 A1* | 9/2014 | Lee | H01M 10/44 |
| | | | 320/134 |
| 2014/0300364 A1* | 10/2014 | Choi | H04Q 9/00 |
| | | | 324/426 |
| 2014/0347013 A1* | 11/2014 | Kim | H02J 7/0014 |
| | | | 320/134 |
| 2014/0347014 A1* | 11/2014 | Lee | H02J 7/0016 |
| | | | 320/134 |
| 2015/0028816 A1* | 1/2015 | Lee | H02J 7/0021 |
| | | | 320/134 |
| 2015/0155602 A1* | 6/2015 | Hwang | H01M 10/425 |
| | | | 429/50 |
| 2015/0288212 A1* | 10/2015 | Kim | H02H 3/24 |
| | | | 307/80 |
| 2015/0349550 A1* | 12/2015 | Jeon | H02J 7/0014 |
| | | | 320/134 |
| 2016/0020622 A1* | 1/2016 | Kwon | B60L 58/18 |
| | | | 320/128 |
| 2016/0308375 A1* | 10/2016 | Pognant-Gros | H02J 7/0016 |
| 2016/0336623 A1* | 11/2016 | Nayar | H01M 4/38 |
| 2017/0085129 A1 | 3/2017 | Zeine et al. | |
| 2018/0012484 A1* | 1/2018 | Sakabe | G08C 17/00 |
| 2019/0006724 A1* | 1/2019 | Cho | H01M 10/425 |
| 2019/0052099 A1* | 2/2019 | Hong | H01M 10/42 |
| 2019/0067755 A1* | 2/2019 | Kim | H01M 10/425 |
| 2019/0123404 A1* | 4/2019 | Kim | H01M 10/625 |
| 2019/0131814 A1* | 5/2019 | Robbins | H02J 7/0026 |
| 2019/0181656 A1* | 6/2019 | Cooper | H02J 7/0016 |
| 2019/0260097 A1* | 8/2019 | Kwon | H01M 10/482 |
| 2019/0299799 A1* | 10/2019 | Hinterberger | H01M 2/206 |
| 2019/0305386 A1* | 10/2019 | Lee | G01R 31/371 |

FOREIGN PATENT DOCUMENTS

| | | |
|---|---|---|
| KR | 10-2013-0101457 A | 9/2013 |
| KR | 10-2014-0060801 A | 5/2014 |
| KR | 10-2014-0073949 A | 6/2014 |
| KR | 10-2014-0110574 A | 9/2014 |
| KR | 10-2014-0121186 A | 10/2014 |
| KR | 10-2015-0046599 A | 4/2015 |
| KR | 10-1631064 B1 | 6/2016 |

OTHER PUBLICATIONS

Karthi J S et al: "Duty Cycle Adapted MAC for Wireless Sensor Networks with Energy Harvesting", 2015 International Conference on Control, Communication & Computing India (ICCC), IEEE, Nov. 19-21, 2015, pp. 685-690, XP032881373, DO 1: 10.1109/1CCC.2015.7432982.

Rajgopal Kannan et al: "Energy and Rate based MAC Protocol for Wireless Sensor Networks", SIGMOD Record, ACM, New York, NY, US, vol. 32, No. 4, Dec. 1, 2003, pp. 60-65, XP058268473, ISSN: 0163-5808, DOI: 10.1145/959060.959071.

Yan-Xiao Li et al: "An Efficient Energy Aware MAC Protocol for Wireless Sensor Network", Multimedia Technology (ICMT), 2010 International Conference on, IEEE, Piscataway, NJ, USA, Oct. 29, 2010, pp. 1-4, XP031797868, ISBN: 978-1-4244-7871-2.

\* cited by examiner

WIRELESS BATTERY MANAGEMENT SYSTEM AND BATTERY PACK INCLUDING SAME

TECHNICAL FIELD

The present disclosure relates to a wireless battery management system, and more particularly, to a wireless battery management system for reducing a residual capacity deviation between battery modules and a battery pack including the same.

The present application claims priority to Korean Patent Application No. 10-2017-0092151 filed in the Republic of Korea on Jul. 20, 2017, the disclosures of which are incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect, and thus they are gaining more attention than nickel-based secondary batteries for their advantages of free charging and discharging, very low self-discharging and high energy density.

A battery pack applied to electric vehicles generally includes a plurality of battery modules connected in series and a plurality of battery management systems (BMSs). Each BMS monitors and controls the state of the battery module that the BMU manages. Recently, to meet the demand for high-capacity high-output battery packs, the number of battery modules included in a battery pack also increases. To efficiently manage the state of each battery module included in the battery pack, a single master-multi slave structure is disclosed. The single master-multi slave structure includes a plurality of slave BMSs installed in each battery module and a master BMS that controls the overall operation of the plurality of slave BMSs. In this instance, communication between the plurality of slave BMSs and the master BMS may be performed by a wireless method.

Each of the plurality of slave BMSs transmits a wireless signal to the master BMS or receives a wireless signal from the master BMS using electrical energy of the battery module in which the slave BMS is coupled.

Meanwhile, due to the environment in which the battery pack operates or the electrical and chemical properties of the individual battery module, a residual capacity deviation often occurs between the plurality of battery modules. To reduce the residual capacity deviation between the plurality of battery modules, balancing control is necessary.

However, most of conventional technologies related to balancing have applications in systems designed for communication between a plurality of slave BMSs and a master BMS through wired means such as a cable.

DISCLOSURE

Technical Problem

The present disclosure is directed to providing a wireless battery management system for performing module balancing to reduce a residual capacity deviation between battery modules by transmitting a radio frequency (RF) signal through a non-communication wireless channel using electrical energy of at least one of the battery modules, and a battery pack including the same.

These and other objects and advantages of the present disclosure will be understood by the following description and will be apparent from the embodiments of the present disclosure. Further, it will be readily understood that the objects and advantages of the present disclosure can be realized by the means set forth in the appended claims and combinations thereof.

Technical Solution

Various embodiments of the present disclosure for achieving the above-described object are as follows.

A wireless battery management system according to an aspect of the present disclosure includes a master battery management system (BMS) configured to transmit a first radio frequency (RF) signal including a state detection command through a first wireless channel. The wireless battery management system further includes a plurality of slave BMSs coupled to a plurality of battery modules in one-to-one correspondence. Each of the plurality of slave BMSs is configured to detect state information of the battery module to which the slave BMS is coupled in response to the first RF signal, and transmit a second RF signal indicating the state information of the battery module through the first wireless channel. The master BMS is configured to determine a wireless balancing time for each of the plurality of battery modules based on the second RF signal, and transmit a third RF signal including a module balancing command indicating the wireless balancing time to the plurality of slave BMSs through the first wireless channel. Each of the plurality of slave BMSs is configured to transmit a fourth RF signal through a second wireless channel during balancing of the plurality of battery modules using electrical energy of the battery module to which the corresponding slave BMS is coupled according to the module balancing command included in the third RF signal.

The first wireless channel may have a preset first frequency range. In this case, the second wireless channel may have a preset second frequency range that is separated from the first frequency range.

The master BMS may calculate a module residual capacity stored in each of the plurality of battery modules based on the second RF signal, and determine the wireless balancing time for each of the plurality of battery modules based on the module residual capacity of each of the plurality of battery modules.

The master BMS may set the module residual capacity of one of the plurality of battery modules as a first target residual capacity, and determine the wireless balancing time for each of the plurality of battery modules based on a difference between the first target residual capacity and each of the other module residual capacities.

The state information of the battery module may include state information of each battery cell included in the battery module. The master BMS may calculate a cell residual capacity of each battery cell included in each of the plurality of battery modules based on the second RF signal, and determine the wireless balancing time for each of the plurality of battery modules based on the cell residual capacity of each battery cell included in each of the plurality of battery modules.

The master BMS may determine a smallest cell residual capacity of cell residual capacities of all battery cells included in the plurality of battery modules as second target residual capacity, and determine the wireless balancing time for each of the plurality of battery modules not having the smallest cell residual capacity further based on a difference between the second target residual capacity and a minimum cell residual capacity of the battery module.

The master BMS may determine, for each battery module, a wired balancing time for each battery cell included in the battery module based on a difference between the cell residual capacity and the minimum cell residual capacity of the battery module. In this case, the third RF signal may further include a cell balancing command indicating the wired balancing time.

Each of the plurality of slave BMSs may include a wired balancing unit electrically connected to two ends of each battery cell included in the battery module in which corresponding slave BMS is coupled. Each of the plurality of slave BMSs may balance the cell residual capacity of each battery cell included in the battery module in which corresponding slave BMS is coupled by controlling the wired balancing unit according to the cell balancing command included in the third RF signal.

A battery pack according to another aspect of the present disclosure includes the wireless battery management system and the plurality of battery modules.

Advantageous Effects

According to at least one of the embodiments of the present disclosure, it is possible to perform module balancing to reduce a residual capacity deviation between battery modules by transmitting a radio frequency (RF) signal through a non-communication wireless channel using electrical energy of at least one of the battery modules.

Additionally, according to at least one of the embodiments of the present disclosure, it is possible to performed module balancing even while state information from each battery module is being detected, thereby reducing the time required to finish module balancing and cell balancing completely.

Additionally, according to at least one of the embodiments of the present disclosure, module balancing is performed first based on the minimum cell residual capacity of each battery module and then cell balancing is performed, so there is available time for cell balancing.

The effects of the present disclosure are not limited to the above-mentioned effects, and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus, the present disclosure should not be construed as being limited to the drawings.

MODE FOR CARRYING OUT THE INVENTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

It should be noted that the term "BMS" as used herein is a shorted form of Battery Management System.

Figure 1:
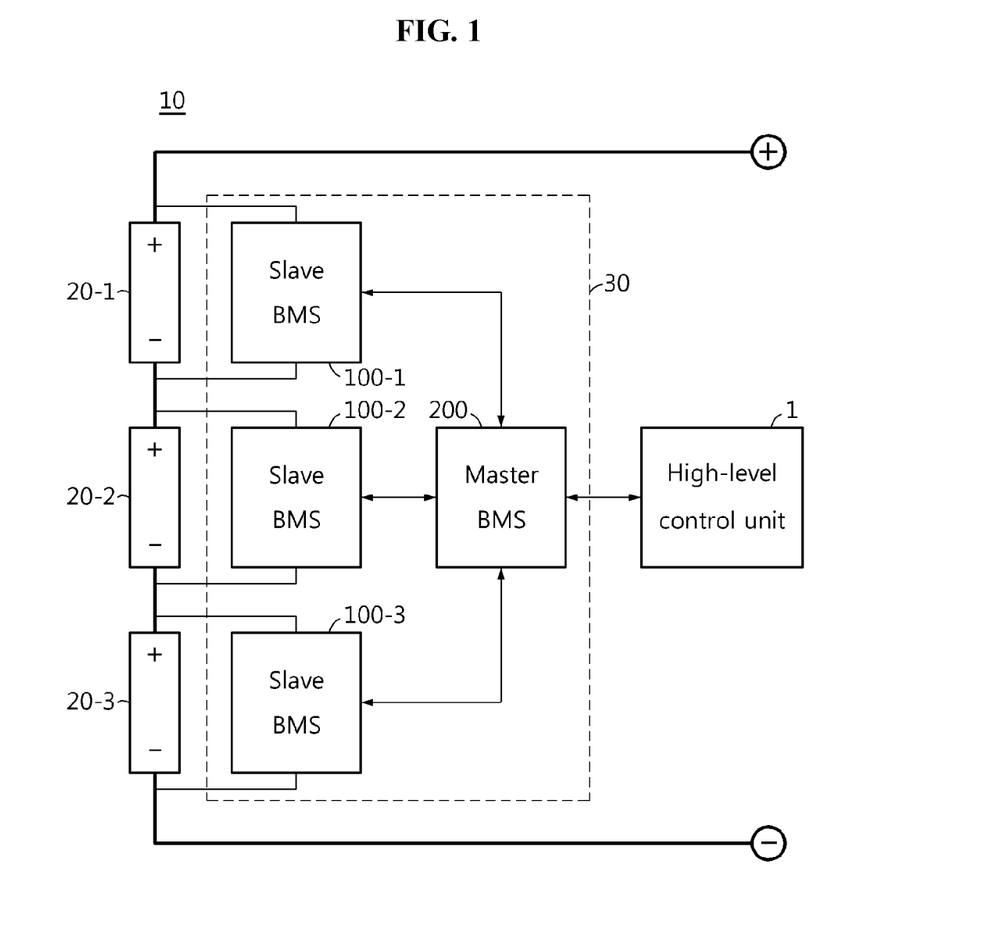
FIG. 1 is a schematic diagram showing configuration of a wireless battery management system according to an embodiment of the present disclosure and a battery pack including the same.

FIG. 1 is a schematic diagram showing configuration of a wireless battery management system 30 according to an embodiment of the present disclosure and a battery pack 10 including the same.

Referring to FIG. 1, the battery pack 10 includes a plurality of battery modules 20 and a wireless battery management system 30. Each battery module 20 may include at least one battery cell (see 21 in FIG. 2). The wireless battery management system 30 includes a plurality of slave BMSs 100 and at least one master BMS 200. The battery pack 10 may be mounted in an electric vehicle to supply power required for operating an electric motor of the electric vehicle.

Hereinafter, for convenience of description, assume that the battery pack 10 includes three battery modules 20-1~20-3 connected in series, each battery module 20 includes three battery cells 21 connected in series, and the wireless battery management system 30 includes three slave BMSs 100-1~100-3 and a single master BMS 200. However, the scope of the present disclosure is not limited thereto. For example, the battery pack 10 may include only two battery modules 20 or four or more battery modules 20. Of course, the wireless battery management system 30 may include two slave BMSs 100 or four or more slave BMSs 100, and may include two or more master BMSs 200.

The plurality of slave BMSs 100-1~100-3 is coupled in one-to-one correspondence to the plurality of battery modules 20-1~20-3 included in the battery pack 10.

Each of the plurality of slave BMSs 100-1~100-3 is electrically connected to one of the plurality of battery modules 20-1~20-3. Each of the plurality of slave BMSs 100-1~100-3 detects the overall state (for example, voltage, current, temperature) of the battery modules 20-1~20-3 electrically connected to the slave BMSs 100-1~100-3, and performs a variety of control functions (for example, charging, discharging, balancing) to adjust the state of the battery modules 20-1~20-3. Each control function may be performed directly by the slave BMS 100 based on the state of the battery module 20, or may be performed according to the command from the master BMS 200.

Figure 2:
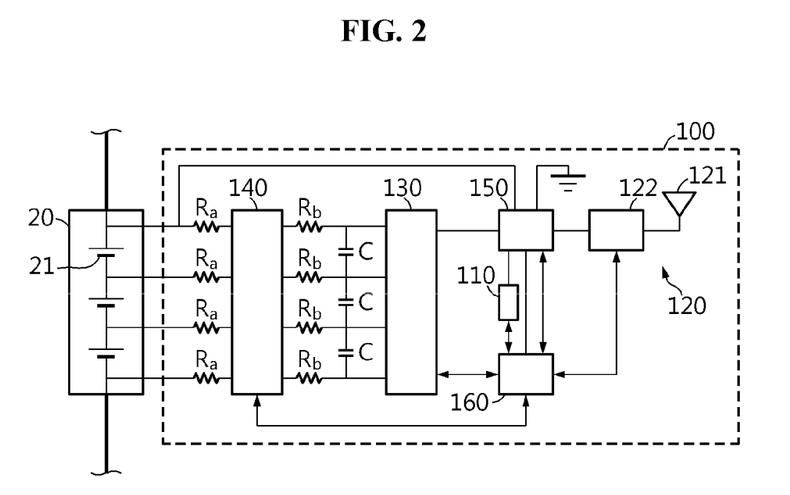
FIG. 2 is a schematic diagram showing configuration of a slave BMS shown in FIG. 1.
Figure 3:
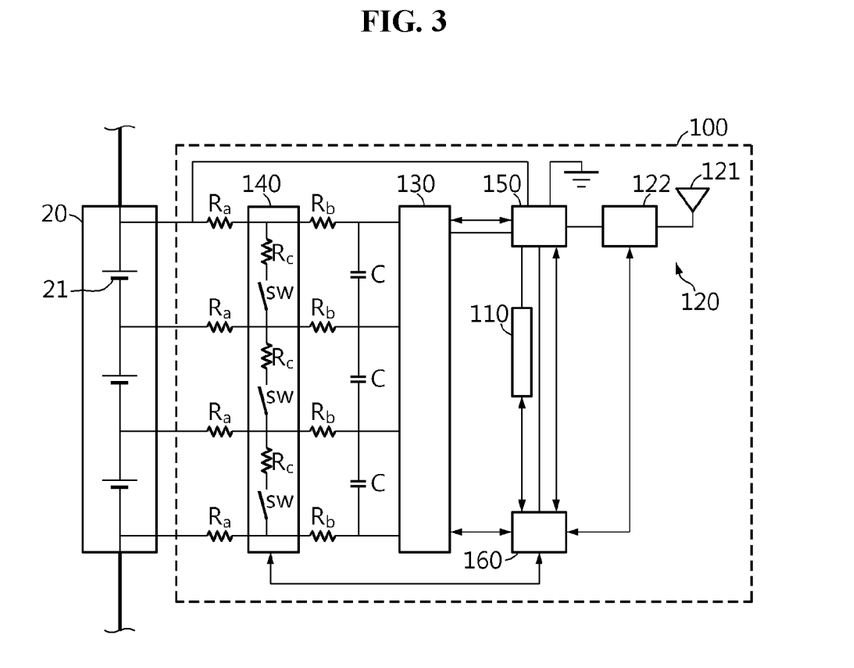
FIG. 3 is a schematic diagram showing configuration of a wired balancing unit according to an embodiment of the present disclosure.

FIG. 2 is a schematic diagram showing configuration of the slave BMS 100 shown in FIG. 1, and FIG. 3 is a schematic diagram showing configuration of a wired balancing unit 140 according to an embodiment of the present disclosure.

Referring to FIG. 2, each slave BMS 100 may include a slave memory 110, a slave communication unit 120, a slave sensing unit 130, a slave power supply unit 150 and a slave control unit 160. Optionally, each slave BMS 100 may further include a wired balancing unit 140.

The slave memory 110 stores an ID allocated to the slave BMS 100. The ID may be allocated in the manufacture of the slave BMS 100 including the slave memory 110. The ID may be used for each slave BMS 100 to perform wireless communication with the master BMS 200. In this instance, the ID allocated to one of the plurality of slave BMSs 100-1~100-3 may be different from the IDs allocated to each of the other slave BMSs.

Each ID may be used for the master BMS 200 to distinguish each slave BMS 100 (e.g. 100-1) from the other slave BMS 100 (e.g. 100-2). Additionally, each ID may represent which of the plurality of battery modules 20-1~20-3 at which the slave BMS 100 with the allocated ID is installed.

The slave memory 110 is not limited to a particular type and includes any known information storage means capable of recording, deleting, updating and reading data. For example, the slave memory 110 may be DRAM, SDRAM, flash memory, ROM, EEPROM and a register. The slave memory 110 may store program codes defining the processes that can be executed by the slave control unit 160.

The slave memory 110 may be physically separated from the slave control unit 160, or may be integrated into a chip with the slave control unit 160.

The slave communication unit 120 includes a slave antenna 121 and a slave communication circuit 122. The slave antenna 121 and the slave communication circuit 122 are operably connected to each other. The slave communication circuit 122 demodulates a wireless signal received by the slave antenna 121. Additionally, the slave communication circuit 122 may modulate a signal provided from the slave control unit 160 and provide it to the slave antenna 121. The slave antenna 121 may transmit a wireless signal corresponding to the signal modulated by the slave communication circuit 122 to the other slave BMS or the master BMS 200 simultaneously or selectively.

The slave sensing unit 130 is configured to detect state information of the battery module 20. For example, the slave sensing unit 130 includes a voltage measurement circuit to detect the voltage of the battery module 20, and optionally, may further include a current measurement circuit to detect the current of the battery module 20, or a temperature detection circuit to detect the temperature of the battery module 20. The slave sensing unit 130 provides the detected state information of the battery module 20 to the slave control unit 160. The slave sensing unit 130 may include at least one application specific integrated circuit (ASIC) having a voltage detection circuit and a temperature detection circuit embedded therein.

The wired balancing unit 140 is configured to reduce a residual capacity deviation between the plurality of battery cells 21 included in each battery module 20. The wired balancing unit 140 is configured to perform cell balancing.

For example, the wired balancing unit 140 discharges the battery cell 21 having higher residual capacity than the other battery cell 21 to equalize the residual capacity between the plurality of battery cells 21.

Referring to FIG. 3, the wired balancing unit 140 includes a plurality of balancing resistors Rc and a plurality of balancing switches SW. A series circuit including one balancing resistor Rc and one balancing switch SW is connected between two ends of each battery cell 21. Accordingly, the number of battery cells 21 per the battery module 20 may be equal to the number of balancing resistors Rc and the number of balancing switches SW included in each wired balancing unit 140.

When the voltage or residual capacity of a specific battery cell 21 is higher than the other battery cell 21, the balancing switch SW connected between two ends of the specific battery cell 21 is turned on, then electrical energy of the specific battery cell 21 is consumed by the balancing resistor Rc.

Meanwhile, in FIG. 2, $R_a$ is a diagnosis resistor, and is used to detect a failure in the wired balancing unit 140. The failure in the wired balancing unit 140 may be, for example, a disconnection or a malfunction of the balancing switch SW. Additionally, in FIG. 2, $R_b$ and C are a protection resistor and a protection capacitor respectively, and act as a RC filter. The RC filter is used to filter off noise (for example, a sharp change in current) entering the sensing unit 130.

The slave power supply unit 150 generates at least one preset level of power source voltage using the power supplied from the battery module 20. The power source voltage generated by the slave power supply unit 150 may be individually supplied to the slave memory 110, the slave communication unit 120, the slave sensing unit 130 and/or and the wired balancing unit 140. Additionally, the power source voltage generated by the slave power supply unit 150 may be supplied to each processor included in the slave control unit 160. For example, first power source voltage generated by the slave power supply unit 150 may be used as the operating power of each processor included in the wired balancing unit 140 and the slave control unit 160, and second power source voltage generated by the slave power supply unit 150 may be used as the operating power of each of the slave memory 110, the slave communication unit 120 and/or the slave sensing unit 130.

The slave power supply unit 150 may perform module balancing of the battery module 20 together with the slave communication unit 120 according to the command of the slave control unit 160.

The slave control unit 160 includes at least one processor, and is operably connected to the slave memory 110, the slave communication unit 120 and the slave power supply unit 150. The slave control unit 160 is configured to manage the overall operation of the slave BMS 100 including the slave control unit 160.

The slave control unit 160 provides the state information of the battery module 20 detected by the slave sensing unit 130 to the slave communication unit 120. Accordingly, the slave communication unit 120 transmits a wireless signal indicating the state information of the battery module 20 to the master BMS 200 through the slave antenna 121.

Each processor included in the slave control unit 160 may selectively include a processor, an application-specific integrated circuit (ASIC), a chipset, a logic circuit, a register, a communication modem and a data processing device known in the art to execute various control logics. At least one of the various control logics of the slave control unit 160 may be combined, and the combined control logics may be written in computer-readable code system and recorded in computer-readable recording media. The recording media is not limited to a particular type and includes any type that can be accessed by a processor included in a computer. For example, the recording media includes at least one selected from the group consisting of ROM, RAM, a register, CD-ROM, a magnetic tape, a hard disk, a floppy disk and an optical data recording device. Additionally, the code system may be modulated to a carrier signal and included in a communication carrier at a particular time point and may be stored and executed in computers connected via a network in distributed manner. Additionally, functional programs, codes and code segments for implementing the combined control logics may be readily inferred by programmers in the technical field to which the present disclosure belongs.

Figure 4:
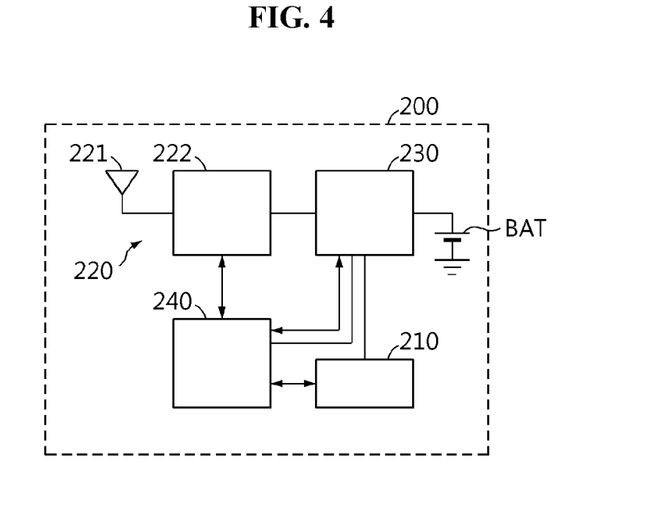
FIG. 4 is a schematic diagram showing configuration of a master BMS shown in FIG. 1.

FIG. 4 is a schematic diagram showing configuration of the master BMS 200 shown in FIG. 1.

Referring to FIG. 4, the master BMS 200 may include a master memory 210, a master communication unit 220, a master power supply unit 230 and a master control unit 240.

The master memory 210 may store an ID table. The ID table includes each ID allocated to the plurality of slave BMSs.

The master memory 210 is not limited to a particular type and includes any known information storage means capable of recording, deleting, updating and reading data. For example, the master memory 210 may be DRAM, SDRAM, flash memory, ROM, EEPROM and a register. The master memory 210 may store program codes defining the processes that can be executed by the slave control unit 160.

The master memory 210 may be physically separated from the master control unit 240, and may be integrated into a chip with the master control unit 240.

The master communication unit 220 includes a master antenna 221 and a master communication circuit 222. The master antenna 221 and the master communication circuit 222 are operably connected to each other. The master communication circuit 222 may demodulate the wireless signal received through the master antenna 221. Additionally, the master communication circuit 222 may modulate a signal to transmit to each slave BMS 100, and transmit the modulated signal wirelessly through the master antenna 221. The master antenna 222 may selectively transmit the wireless signal corresponding to the signal modulated by the master communication unit 220 to at least one of the plurality of slave BMSs 100-1~100-3.

The master power supply unit 230 generates at least one power source voltage using electrical energy supplied from at least one battery module 20, an external power source or its own power source. The power source voltage generated by the master power supply unit 230 may be supplied to the master memory 210 and the master communication unit 220. Additionally, the power source voltage generated by the master power supply unit 230 may be supplied to each processor included in the master control unit 240.

The master control unit 240 includes at least one processor, and is operably connected to the master memory 210 and the master communication unit 220. The master control unit 240 is configured to manage the overall operation of the master BMS 200. Additionally, the master control unit 240 may calculate the State Of Charge (SOC) and/or State Of Health (SOH) of each of the plurality of battery modules 20-1~20-3 based on the wireless signals corresponding to sensing information from each of the plurality of slave BMSs 100-1~100-3 among the wireless signals received through the master antenna 221. Additionally, the master control unit 240 may generate information for controlling the charging, discharging and/or balancing of each of the plurality of slave BMSs 100 based on the calculated SOC and/or SOH, and selectively transmit it to at least one of the plurality of slave BMSs 100-1~100-3 through the master antenna 221 and the master communication unit 220.

Each processor included in the master control unit 240 may selectively include a processor, an application-specific integrated circuit (ASIC), a chipset, a logic circuit, a register, a communication modem and a data processing device known in the art to execute various control logics. At least one of the various control logics of the master control unit 240 may be combined, and the combined control logics may be written in computer-readable code system and recorded in computer-readable recording media. The recording media is not limited to a particular type and includes any type that can be accessed by a processor included in a computer. For example, the recording media includes at least one selected from the group consisting of ROM, RAM, a register, CD-ROM, a magnetic tape, a hard disk, a floppy disk and an optical data recording device. Additionally, the code system may be modulated to a carrier signal and included in a communication carrier at a particular time point and may be stored and executed in computers connected via a network in distributed manner. Additionally, functional programs, codes and code segments for implementing the combined control logics may be readily inferred by programmers in the technical field to which the present disclosure belongs.

Referring to FIGS. 1 to 4, the master BMS 200 transmits a wireless signal (hereinafter referred to as a 'first RF signal') including a state detection command to the plurality of slave BMSs 100-1~100-3.

In each predetermined cycle or in response to the first RF signal, each slave BMS 100 detects state information of the battery module 20 in which the slave BMS 100 is coupled to. The state information of the battery module 20 represents the voltage, current and/or temperature of the battery module 20. Optionally, the state information of the battery module 20 may further include state information of each battery cell 21 included in the battery module 20. The state information of the battery cell 21 represents the voltage, current and/or temperature of each of the battery cell 21.

Each slave BMS 100 is configured to transmit a wireless signal (hereinafter referred to as a 'second RF signal') indicating the state information of the battery module 20 to the master BMS 200.

The master BMS 200 receives the second RF signal from each of the plurality of slave BMSs 100-1~100-3 through the master antenna 221. The master BMS 200 calculates the module residual capacity of each of the plurality of battery modules 20-1~20-3 based on the second RF signal received from each of the plurality of slave BMSs 100-1~100-3. The module residual capacity represents the State Of Charge (SOC) of the battery module 20.

Optionally, the master BMS 200 may further calculate the cell residual capacity of each battery cell 21 included in each of the plurality of battery modules 20-1~20-3 based on the second RF signal received from each of the plurality of slave BMSs 100-1~100-3. The cell residual capacity represents the SOC of the battery cell 21.

Subsequently, the master BMS 200 determines the wireless balancing time for each of the plurality of battery modules 20-1~20-3 according to one of a first balancing rule and a second balancing rule. The first balancing rule may be for determining the wireless balancing time for each of the plurality of battery modules 20-1~20-3 based on the module residual capacity of each of the plurality of battery modules 20-1~20-3. The second balancing rule may be for determining the wireless balancing time for each of the plurality of battery modules 20-1~20-3 based on the cell residual capacity of each battery cell 21 included in each of the plurality of battery modules 20-1~20-3.

The master BMS 200 may store the wireless balancing time determined for each of the plurality of slave BMSs 100-1~100-3 in the master memory 210. Along with this or aside from this, the master BMS 200 generates a module balancing command indicating the wireless balancing time determined for each of the plurality of slave BMSs 100-1~100-3. Subsequently, the master BMS 200 may transmit a wireless signal (hereinafter referred to as a 'third RF signal') including the module balancing command to the plurality of slave BMSs 100-1~100-3.

Each of the plurality of slave BMSs 100-1~100-3 receives the third RF signal through the slave antenna 121. Each of the plurality of slave BMSs 100-1~100-3 stores its wireless balancing time determined by the master BMS 200 in the slave memory 110 according to the module balancing command included in the received third RF signal. Additionally, each of the plurality of slave BMSs 100-1~100-3 transmits a wireless signal (hereinafter referred to as a 'fourth RF signal') during its wireless balancing time determined by the master BMS 200 using electrical energy of the battery module 20 in which the slave BMS 100-1~100-3 is coupled to. In this case, the fourth RF signal may be transmitted with the maximum power that is preset for the slave antenna 121.

Each of the first to third RF signals is a wireless signal transmitted and received through a first wireless channel. In contrast, the fourth RF signal is a wireless signal transmitted by each slave BMS 100 through a second wireless channel. In this instance, the first wireless channel is a communication channel, and has a preset first frequency range. In contrast, the second wireless channel is a non-communication channel, and has a preset second frequency range that is separated from the first frequency range. The slave communication units 120 of each slave BMS 100 are designed to selectively access the first and second wireless channels. In contrast, the master communication unit 220 of the master BMS 200 may be designed to access only the first wireless channel among the first and second wireless channels. Accordingly, the fourth RF signal may not affect the operation of the master BMS 200.

The following is a detailed description of each of embodiments in which the master BMS 200 controls the plurality of slave BMSs 100-1~100-3 to reduce a module residual capacity deviation between the plurality of battery modules 20-1~20-3 and a cell residual capacity deviation between the plurality of battery cells 21 included in each battery module 20. In each embodiment, assume that electrical energy consumed from each battery module 20 by the operation other than module balancing and cell balancing is so small to be negligible, compared to electrical energy consumed from each battery module 20 by module balancing and cell balancing.

Figure 5:
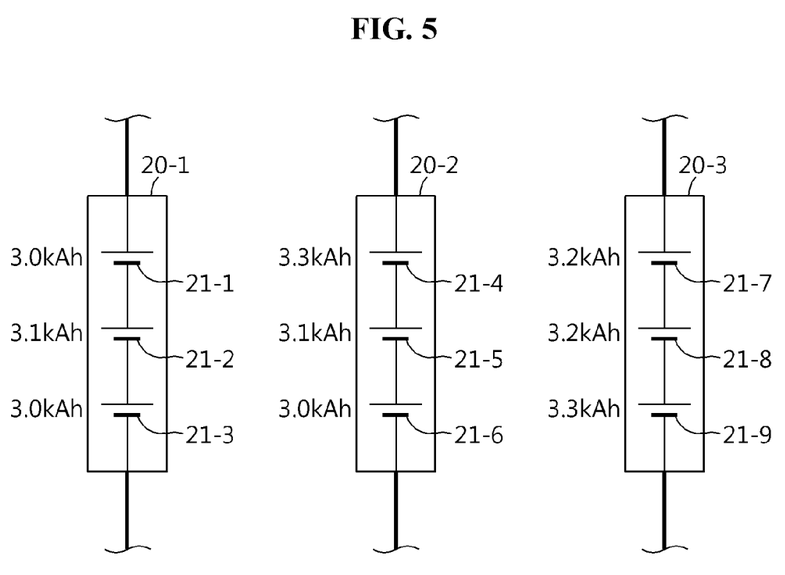
FIGS. 5 and 6 are diagrams for reference in describing the operation of balancing a plurality of battery modules according to a first balancing rule by a wireless battery management system according to an embodiment of the present disclosure.
Figure 6:
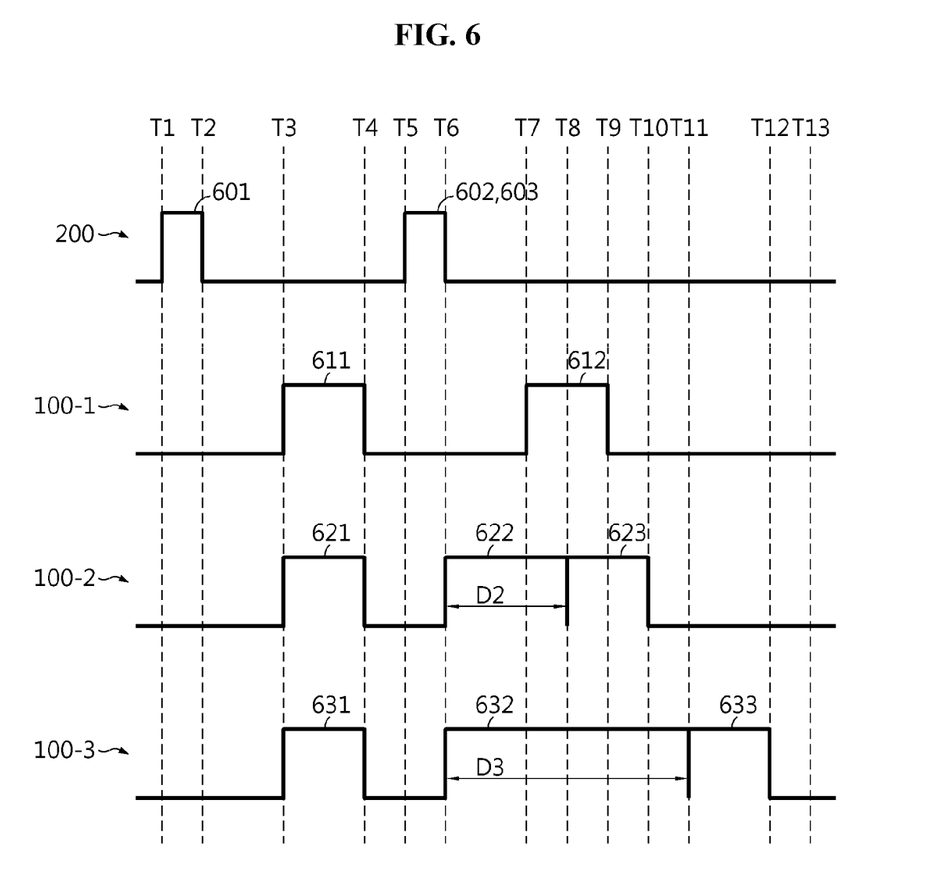

FIGS. 5 and 6 are diagrams for reference in describing the operation of balancing the plurality of battery modules according to the first balancing rule by the wireless battery management system 30 according to an embodiment of the present disclosure.

FIG. 5 shows one exemplary state before determining the wireless balancing time for each of the plurality of battery modules 20-1~20-3.

Referring to FIG. 5, the cell residual capacities of three battery cells 21-1~21-3 included in the first battery module 20-1 are 3.0 kAh, 3.1 kAh and 3.0 kAh respectively, the cell residual capacities of three battery cells 21-4~21-6 included in the second battery module 20-2 are 3.3 kAh, 3.1 kAh and 3.0 kAh respectively, and the cell residual capacities of three battery cells 21-7~21-9 included in the third battery module 20-3 are 3.2 kAh, 3.2 kAh and 3.3 kAh respectively. Accordingly, the module residual capacity of the first battery module 20-1 is 9.1 kAh, the module residual capacity of the second battery module 20-2 is 9.4 kAh, and the module residual capacity of the third battery module 20-3 is 9.7 kAh. Here, kAh is an abbreviation of kilo ampere hour, and is a unit that indicates the residual capacity.

The master BMS 200 sets the module residual capacity of one of the plurality of battery modules 20-1~20-3 as first target residual capacity. In the first balancing rule, the smallest module residual capacity 9.1 KAh among the module residual capacities 9.1 kAh, 9.4 kAh and 9.7 kAh of the plurality of battery modules 20-1~20-3 may be set as the first target residual capacity.

The master BMS 200 determines the wireless balancing time for each of the plurality of battery modules 20-1~20-3 based on the differences between the first target residual capacity 9.1 kAh and each of the other module residual capacities 9.4 kAh, 9.7 kAh. Specifically, the master BMS 200 determines the wireless balancing time for the second battery module 20-2 based on the difference 0.3 kAh between the first target residual capacity 9.1 kAh and the module residual capacity 9.4 kAh of the second battery module 20-2. Additionally, the master BMS 200 determines the wireless balancing time for the third battery module 20-3 based on the difference 0.6 KAh between the first target residual capacity 9.1 kAh and the module residual capacity 9.7 kAh of the third battery module 20-3.

In this instance, with the increasing difference between the module residual capacity of each battery module 20 and the first target residual capacity, the wireless balancing time determined for each battery module 20 may increase. For example, the wireless balancing time ('D3' in FIG. 6) determined for the third battery module 20-3 is longer than the wireless balancing time ('D2' in FIG. 6) determined for the second battery module 20-2.

Meanwhile, there is no need for module balancing of the first battery module 20-1 having the same module residual capacity as the first target residual capacity 9.1 kAh. Accordingly, the master BMS 200 may determine the wireless balancing time for the first battery module 20-1 having the same module residual capacity as the first target residual capacity 9.1 kAh to be equal to the reference time (for example, 0 sec).

FIG. 6 is a timing chart illustrating the operation for balancing the plurality of battery modules 20-1~20-3 shown in FIG. 5 by the wireless battery management system 30.

Referring to FIG. 6, between time points T1 and T2, the master BMS 200 transmits the first RF signal 601 to the plurality of slave BMSs 100-1~100-3 through the first wireless channel. At the time point T1, a difference between the smallest and second smallest of the module residual capacities of the plurality of battery modules 20-1~20-3 may be less than first threshold. When the difference between the smallest and second smallest of the module residual capacities of the plurality of battery modules 20-1~20-3 is less than the first threshold, module balancing may be stopped.

Between time points T2 and T3, in response to the first RF signal 601, each of the plurality of slave BMSs 100-1~100-3 detects state information of each of the battery modules 20-1~20-3 in which the slave BMS 100-1~100-3 is coupled.

Between time points T3 and T4, each of the plurality of slave BMSs 100-1~100-3 transmits the second RF signal 611, 621, 631 indicating the state information (see FIG. 5) detected from the battery modules 20-1~20-3 in which each of the slave BMS 100-1~100-3 is coupled to the master BMS 200 through the first wireless channel.

Between time points T4 and T5, the master BMS 200 determines the wireless balancing time for each of the plurality of battery modules 20-1~20-3 based on the second RF signal 611, 621, 631.

Between time points T5 and T6, the master BMS 200 transmits the first RF signal 602 and the third RF signal 603 to the plurality of slave BMSs 100-1~100-3 through the first wireless channel. The third RF signal 603 includes a module balancing command indicating the wireless balancing time determined for each of the plurality of battery modules 20-1~20-3.

As described above, the wireless balancing time for the first battery module 20-1 may be 0 sec. Accordingly, the first slave BMS 100-1 does not perform module balancing of the first battery module 20-1. Between time points T6 and T7, in response to the first RF signal 602, the first slave BMS 100-1 detects state information of the first battery module 20-1. In this case, until the time point T7, the module residual capacity of the first battery module 20-1 may be maintained at 9.1 kAh. Subsequently, between time points T7 and T9, the first slave BMS 100-1 may transmit the second RF signal 612 indicating the state information of the first battery module 20-1 to the master BMS 200 through the first wireless channel.

Between time points T6 and T8, the second slave BMS 100-2 transmits the fourth RF signal 622 through the second wireless channel using electrical energy of the second battery module 20-2 during the wireless balancing time D2 according to the module balancing command included in the third RF signal 603. Accordingly, after transmission of the fourth RF signal 622 than before, the module residual capacity of the second battery module 20-2 is closer to the first target residual capacity 9.1 kAh. For example, by module balancing during the wireless balancing time D2, the cell residual capacities of the three battery cells 21-4~21-6 are reduced by 0.1 kAh and reach 3.2 kAh, 3.0 kAh and 2.9 kAh respectively, and thus the module residual capacity of the second battery module 20-2 at the time point T8 may be equal to the first target residual capacity 9.1 kAh.

Between time points T6 and T8 or at the time point T8, the second slave BMS 100-2 may detect state information of the second battery module 20-2. From the time point T6 to the time point T8, cell balancing of the battery cells 21-4~21-6 included in the second battery module 20-2 may not be performed. That is, from the time point T6 to the time point T8, all the balancing switches SW of the wired balancing unit 140 of the second slave BMS 100-2 may be turned off. Accordingly, the slave sensing unit 130 of the second slave BMS 100-2 may detect state information of the second battery module 20-2.

Between time points T8 and T10, the second slave BMS 100-2 transmits the second RF signal 623 indicating the state information of the second battery module 20-2 to the master BMS 200 through the first wireless channel.

Between time points T6 and T11, the third slave BMS 100-3 transmits the fourth RF signal 632 through the second wireless channel using electrical energy of the third battery module 20-3 for the wireless balancing time D3 according to the module balancing command included in the third RF signal 603. Accordingly, after transmission of the fourth RF signal 632 than before, the module residual capacity of the third battery module 20-3 is closer to the first target residual capacity 9.1 kAh. For example, by module balancing for the wireless balancing time D3, the cell residual capacities of the three battery cells 21-7~21-9 are reduced by 0.2 kAh when compared to FIG. 5 and reach 3.0 kAh, 3.0 kAh and 3.1 kAh respectively, and thus the module residual capacity of the third battery module 20-3 at the time point T11 may be equal to the first target residual capacity 9.1 kAh.

Between time points T6 and T11 or at the time point T11, the third slave BMS 100-3 may detect state information of the third battery module 20-3. From the time point T6 to the time point T11, cell balancing of the battery cells 21-7~21-9 included in the third battery module 20-3 may not be performed. That is, from the time point T6 to the time point T11, all the balancing switches SW of the wired balancing unit 140 of the third slave BMS 100-3 may be turned off. Accordingly, the slave sensing unit 130 of the third slave BMS 100-3 may detect state information of the third battery module 20-3.

Between time points T11 and T12, the third slave BMS 100-3 may transmit the second RF signal 633 indicating the state information of the third battery module 20-3 to the master BMS 200 through the first wireless channel.

Meanwhile, the module balancing command of the third RF signal 603 is for reducing a difference in module residual capacities of the plurality of battery modules 20-1~20-3, but not a difference in cell residual capacities of the plurality of battery cells 21 included in the common battery module 20. It is because, as shown in FIG. 5, when one of the plurality of battery cells 20 connected in series within the same battery module 20 is discharged, each of the other battery cells is discharged as much during module balancing.

To reduce a difference in cell residual capacity of the plurality of battery cells 21, the wired balancing time for at least one battery cell 21 included in the plurality of battery modules 20-1~20-3 may be further determined. In this instance, the wired balancing time determined for each battery cell 21 may be based on a difference between the cell residual capacity of each battery cell 21 and the minimum cell residual capacity of the battery module 20 including each battery cell 21.

For example, the wired balancing time for the battery cell 21-2 may be determined based on a difference 0.1 kAh between the cell residual capacity 3.1 kAh of the battery cell 21-2 and the minimum cell residual capacity 3.0 kAh of the first battery module 20-1 including the battery cell 21-2. As another example, the wired balancing time for the battery cell 21-4 may be determined based on a difference 0.3 kAh between the cell residual capacity 3.3 kAh of the battery cell 21-4 and the minimum cell residual capacity 3.0 kAh of the second battery module 20-2 including the battery cell 21-4.

The master BMS 200 may further include a cell balancing command in the third RF signal 603. The cell balancing command may represent the wired balancing time for at least one battery cell 21 included in the plurality of battery modules 20-1~20-3.

The first slave BMS 100-1 may perform selective cell balancing of the three battery cells 21-1~21-3 by controlling the wired balancing unit 140 included in the first slave BMS 100-1 according to the cell balancing command of the third RF signal 603. After the time point T9, the first slave BMS 100-1 may discharge at least one of the three battery cells 21-1~21-3 by controlling the balancing switch SW of the wired balancing unit 140. T13 may be the time point at which the master BMS 200 transmits a new third RF signal through the first wireless channel.

For example, the first slave BMS 100-1 may turn on the balancing switch SW connected between two ends of the battery cell 21-2, and turn off the balancing switch SW connected between two ends of each of the other battery cells 21-1, 21-3 to reduce the cell residual capacity of the battery cell 21-2 by 0.1 kAh. In this instance, the balancing switch SW connected between two ends of the battery cell 21-2 may be turned on for the wired balancing time determined for the battery cell 21-2. Accordingly, at an arbitrary time point after the time point T9, the cell residual capacities of the three battery cells 21-121-3 may be all equalized and reach 3.0 kAh respectively. That is, the module residual capacity of the first battery module 20-1 may be 9.0 kAh.

The second slave BMS 100-2 may perform selective cell balancing of the three battery cells 21-4~21-6 by controlling the wired balancing unit 140 according to the cell balancing command of the third RF signal 603. For at least some time between the time points T10 and T13, the second slave BMS 100-2 may discharge at least one of the three battery cells 21-4~21-6 by controlling the balancing switch SW of the wired balancing unit 140. For example, the second slave BMS 100-2 may turn on the balancing switch SW connected between two ends of the battery cell 21-4 to reduce the cell residual capacity of the battery cell 21-4 by 0.3 kAh, turn on the balancing switch SW connected between two ends of the battery cell 21-5 to reduce the cell residual capacity of the battery cell 21-5 by 0.1 kAh, and turn off the balancing switch SW connected between two ends of the remaining battery cell 21-6. In this instance, the balancing switch SW connected between two ends of the battery cell 21-4 may be turned on for the wired balancing time determined for the battery cell 21-4. Additionally, the balancing switch SW connected between two ends of the battery cell 21-5 may be turned on for the wired balancing time determined for the battery cell 21-5. Accordingly, at an arbitrary time point after the time point T10, the cell residual capacities of the three battery cells 21-4~21-6 may be all equalized and reach 2.9 kAh respectively. That is, the module residual capacity of the second battery module 20-2 may be 8.7 kAh.

The third slave BMS 100-3 may perform selective cell balancing of the three battery cells 21-7~21-9 by controlling the wired balancing unit 140 according to the cell balancing command of the third RF signal 603. For at least some time between the time points T12 and T13, the third slave BMS 100-3 may discharge at least one of the three battery cells 21-7~21-9 by controlling the balancing switch SW of the wired balancing unit 140. For example, the third slave BMS 100-3 may turn off the balancing switch SW connected between two ends of the battery cell 21-8, turn on the balancing switch SW connected between two ends of the battery cell 21-9 to reduce the cell residual capacity of the battery cell 21-9 by 0.1 kAh, and turn off the balancing switch SW connected between two ends of the remaining battery cell 21-7. In this instance, the balancing switch SW connected between two ends of the battery cell 21-9 may be turned on for the wired balancing time determined for the battery cell 21-9. Accordingly, at an arbitrary time point after the time point T12, the cell residual capacities of the three battery cells 21-7~21-9 may be all equalized and reach 3.0 kAh respectively. That is, the module residual capacity of the third battery module 20-3 may be 9.0 kAh.

Meanwhile, although not shown, after the time point T13, the first and third slave BMSs 100-1, 100-3 may reduce the module residual capacities of each of the first and third battery modules 20-1, 20-3 by 0.3 kAh according to the module balancing command included in a new third RF signal from the master BMS 200. Accordingly, the module residual capacities of the first to third battery modules 20-1~20-3 are all equalized and reach 8.7 kAh.

Figure 7:
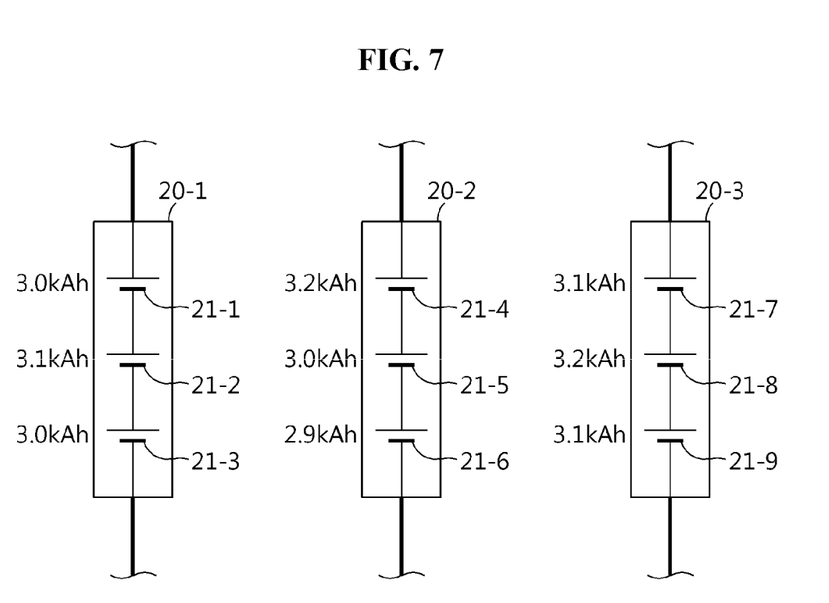
FIGS. 7 and 8 are diagrams for reference in describing the operation of balancing a plurality of battery modules according to a second balancing rule by a wireless battery management system according to an embodiment of the present disclosure.
Figure 8:
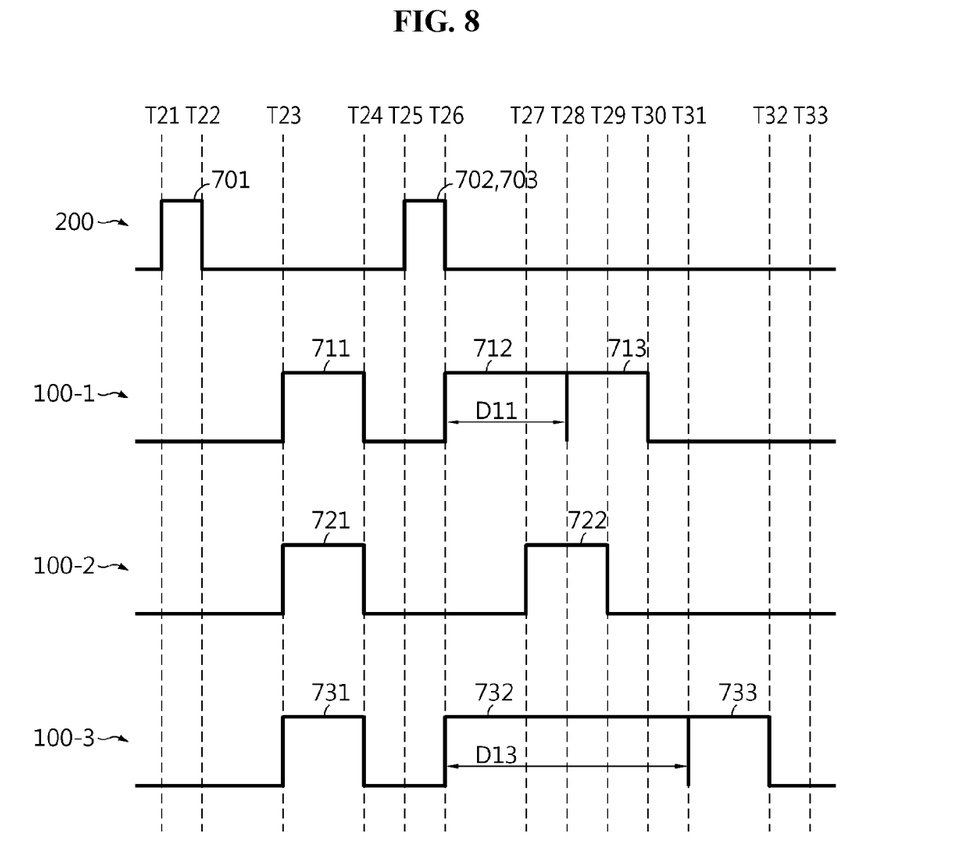

FIGS. 7 and 8 are diagrams for reference in describing the operation of balancing the plurality of battery modules according to the second balancing rule by the wireless battery management system 30 according to an embodiment of the present disclosure. FIG. 7 shows other exemplary state before determining the wireless balancing time for each of the plurality of battery modules 20-1~20-3.

Referring to FIG. 7, as opposed to FIG. 6, the cell residual capacities of the three battery cells 21-1~21-3 included in the first battery module 20-1 are 3.0 kAh, 3.1 kAh, 3.0 kAh respectively, the cell residual capacities of the three battery cells 21-4~21-6 included in the second battery module 20-2 are 3.2 kAh, 3.0 kAh, 2.9 kAh respectively, and the cell residual capacities of the three battery cells 21-7~21-9 included in the third battery module 20-3 are 3.1 kAh, 3.2 kAh, 3.1 kAh respectively. Accordingly, the module residual capacity of the first battery module 20-1 is 9.1 kAh, the module residual capacity of the second battery module 20-2 is 9.1 kAh, and the module residual capacity of the third battery module 20-3 is 9.4 kAh.

The master BMS 200 sets one of all the battery cells 21-1~21-9 included in the plurality of battery modules 20-1~20-3 as second target residual capacity. In the second balancing rule, a smallest one of all the battery cells 21-1~21-9 included in the plurality of battery modules 20-1~20-3 is determined as the second target residual capacity. In FIG. 7, the cell residual capacity 2.9 kAh of the battery cell 21-6 is set as the second target residual capacity.

Additionally, the master BMS 200 determines the minimum cell residual capacity of each of the plurality of battery modules 20-1~20-3. In the state of FIG. 7, the minimum cell residual capacity of the first battery module 20-1 is determined as the cell residual capacity 3.0 kAh of the battery cell 21-1 or the battery cell 21-3, the minimum cell residual capacity of the second battery module 20-2 is determined as the cell residual capacity 2.9 kAh of the battery cell 21-6, and the minimum cell residual capacity of the third battery module 20-3 is determined as the cell residual capacity 3.1 kAh of the battery cell 21-7 or the battery cell 21-9.

The master BMS 200 may determine the wireless balancing time for each of the plurality of battery modules 20-1~20-3 based on the differences between the second target residual capacity and the minimum cell residual capacities of each of the other battery modules 20.

Specifically, the master BMS 200 determines the wireless balancing time for the first battery module 20-1 based on the difference 0.1 kAh between the second target residual capacity 2.9 kAh and the minimum cell residual capacity 3.0 kAh of the first battery module 20-1.

Additionally, the master BMS 200 determines the wireless balancing time for the third battery module 20-3 based on the difference 0.2 kAh between the second target residual capacity 2.9 kAh and the minimum cell residual capacity 3.1 kAh of the third battery module 20-3.

In this instance, with the increasing difference between the minimum cell residual capacity of each battery module 20 and the second target residual capacity, the wireless balancing time determined for each battery module 20 may increase. For example, the wireless balancing time for the first battery module 20-1 may correspond to 0.3 kAh that is obtained by multiplying the difference 0.1 kAh by the number (3) of battery cells 21 included in the first battery module 20-1, and the wireless balancing time for the third battery module 20-3 may correspond to 0.6 kAh that is obtained by multiplying the difference 0.2 kAh by the number (3) of battery cells 21 included in the third battery module 20-3.

Accordingly, in the state of FIG. 7, the wireless balancing time ('D13' in FIG. 8) for the third battery module 20-3 is longer than the wireless balancing time ('D11' in FIG. 8) for the first battery module 20-1.

Meanwhile, the second target residual capacity 2.9 kAh is equal to the minimum cell residual capacity 2.9 kAh of the second battery module 20-1. In this case, the master BMS 200 may determine the wireless balancing time for the second battery module 20-1 to be equal to the reference time (for example, 0 sec).

FIG. 8 is a timing chart illustrating the operation of balancing the plurality of battery modules 20-1~20-3 shown in FIG. 7 by the wireless battery management system 30.

Referring to FIG. 8, between time points T21 and T22, the master BMS 200 transmits the first RF signal 701 to the plurality of slave BMSs 100-1~100-3 through the first wireless channel. Before the time point T21, a difference between the smallest and second smallest of the minimum cell residual capacities of the plurality of battery modules 20-1~20-3 may be less than second threshold. When a difference between the smallest and second smallest of the minimum cell residual capacities of the plurality of battery modules 20-1~20-3 is less than the second threshold, module balancing may be stopped.

Between time points T22 and T23, in response to the first RF signal 701, each of the plurality of slave BMSs 100-1~100-3 detects state information of the battery module 20 in which the slave BMS 100-1~100-3 is coupled.

Between time points T23 and T24, each of the plurality of slave BMSs 100-1~100-3 transmits the second RF signal 711, 721, 731 indicating the state information (see FIG. 7) detected from the battery module 20-1, 20-3, 20-3 in which the slave BMS 100-1~100-3 is installed to the master BMS 200 through the first wireless channel.

Between time points T24 and T25, the master BMS 200 determines the wireless balancing time for each of the plurality of battery modules 20-1~20-3 based on the second RF signal 711, 721, 731.

Between time points T25 and T26, the master BMS 200 transmits the first RF signal 702 and the third RF signal 703 to the plurality of slave BMSs 100-1~100-3 through the first wireless channel. The third RF signal 703 includes a module balancing command indicating the wireless balancing time determined for each of the plurality of battery modules 20-1~20-3.

Between time points T26 and T28, the first slave BMS 100-1 transmits the fourth RF signal 712 through the second wireless channel for the wireless balancing time D11 using electrical energy of the first battery module 20-1 according to the module balancing command included in the third RF signal 703. Accordingly, after transmission of the fourth RF signal 712 than before, the minimum cell residual capacity of the first battery module 20-1 is closer to the second target residual capacity 2.9 kAh. For example, by module balancing for the wireless balancing time D11, the cell residual capacities of the three battery cells 21-1~21-3 are reduced by 0.1 kAh and reach 2.9 kAh, 3.0 kAh and 2.9 kAh respectively, and thus the minimum cell residual capacity of the first battery module 20-1 at the time point T28 may be equal to the second target residual capacity 2.9 kAh.

Between time points T26 and T28 or at the time point T28, the first slave BMS 100-1 may detect state information of the first battery module 20-1. From the time point T26 to the time point T28, cell balancing of the battery cells 21-1~21-3 included in the first battery module 20-1 may not be performed. That is, from time points T26 to T28, all the balancing switches SW of the wired balancing unit 140 of the first slave BMS 100-1 may be turned off. Accordingly, the slave sensing unit 130 of the first slave BMS 100-1 may detect state information of the first battery module 20-1.

Between time points T28 and T30, the first slave BMS 100-1 transmits the second RF signal 713 indicating the state information of the first battery module 20-1 to the master BMS 200 through the first wireless channel.

As described above, the wireless balancing time for the second battery module 20-2 may be 0 sec. Accordingly, the second slave BMS 100-2 does not perform module balancing of the second battery module 20-2. Between time points T26 and T27, in response to the first RF signal 702, the second slave BMS 100-2 detects state information of the second battery module 20-2. In this case, until the time point T27, the module residual capacity of the second battery module 20-2 may be maintained at 9.1 kAh. Between time points T27 and T29, the second slave BMS 100-2 transmits the second RF signal 722 indicating the state information of the second battery module 20-2 to the master BMS 200 through the first wireless channel.

Between time points T26 and T31, the third slave BMS 100-3 transmits the fourth RF signal 732 through the second wireless channel for the wireless balancing time D13 using electrical energy of the third battery module 20-3 according to the module balancing command included in the third RF signal 703. Accordingly, after transmission of the fourth RF signal 732 than before, the minimum cell residual capacity of the third battery module 20-3 is closer to the second target residual capacity 2.9 kAh. For example, by module balancing for the wireless balancing time D13, the cell residual capacities of the three battery cells 21-7~21-9 are reduced by 0.2 kAh when compared to FIG. 7 and reach 2.9 kAh, 3.0 kAh and 2.9 kAh respectively, and thus the minimum cell residual capacity of the third battery module 20-3 at T31 may be equal to the second target residual capacity 2.9 kAh.

Between time points T26 and T31 or at the time point T31, the third slave BMS 100-3 may detect state information of the third battery module 20-3. From the time point T26 to the time point T31, cell balancing of the battery cells 21-7~21-9 included in the third battery module 20-3 may not be performed. That is, from the time point T26 to the time point T31, all the balancing switches SW of the wired balancing unit 140 of the third slave BMS 100-3 may be turned off. Accordingly, the slave sensing unit 130 of the third slave BMS 100-3 may detect state information of the third battery module 20-3.

Between time points T31 and T32, the third slave BMS 100-3 may transmit the second RF signal 733 indicating the state information of the third battery module 20-3 to the master BMS 200 through the first wireless channel.

Meanwhile, the module balancing command of the third RF signal 703 is for equalizing the minimum cell residual capacities of the plurality of battery modules 20-1~20-3, but not reducing a difference in cell residual capacities of the plurality of battery cells 21 included in the common battery module 20. It is because, as shown in FIG. 7, when one of the plurality of battery cells 20 connected in series within the same battery module 20 is discharged, each of the other battery cells is discharged as much during module balancing.

To reduce a difference in cell residual capacities of the plurality of battery cells 21 included in each battery module 20 for each battery module 20, the master BMS 200 may further include a cell balancing command in the third RF signal 703.

The first slave BMS 100-1 may perform selective cell balancing of the three battery cells 21-1~21-3 by controlling the wired balancing unit 140 according to the cell balancing command of the third RF signal 703. For at least some time between the time points T30 and T33, the first slave BMS 100-1 may discharge at least one of the three battery cells 21-1~21-3 by controlling the balancing switch SW of the wired balancing unit 140. The time point T33 may be the time point at which the master BMS 200 transmits a new third RF signal through the first wireless channel.

For example, the first slave BMS 100-1 may turn on the balancing switch SW connected between two ends of the battery cell 21-2 and turn off the balancing switch SW connected between two ends of each of the other battery cells 21-1, 21-3 to reduce the cell residual capacity of the battery cell 21-2 by 0.1 kAh. In this instance, the balancing switch SW connected between two ends of the battery cell 21-2 may be turned on for the wired balancing time determined for the battery cell 21-2. Accordingly, at an arbitrary time point after the time point T30, the cell residual capacities of the three battery cells 21-1~21-3 may be all equalized and reach 2.9 kAh. That is, the module residual capacity of the first battery module 20-1 may be 8.7 kAh.

The second slave BMS 100-2 may perform selective cell balancing of the three battery cells 21-4~21-6 by controlling the wired balancing unit 140 according to the cell balancing command of the third RF signal 703. For at least some time between time points T29 and T33, the second slave BMS 100-2 may discharge at least one of the three battery cells 21-4~21-6 by controlling the balancing switch SW of the wired balancing unit 140.

For example, the second slave BMS 100-2 may turn on the balancing switch SW connected between two ends of the battery cell 21-4 to reduce the cell residual capacity of the battery cell 21-4 by 0.3 kAh, turn on the balancing switch SW connected between two ends of the battery cell 21-5 to reduce the cell residual capacity of the battery cell 21-5 by 0.1 kAh, and turn off the balancing switch SW connected between two ends of the remaining battery cell 21-6. In this instance, the balancing switch SW connected between two ends of the battery cell 21-4 may be turned on for the wired balancing time determined for the battery cell 21-4. Additionally, the balancing switch SW connected between two ends of the battery cell 21-5 may be turned on for the wired balancing time determined for the battery cell 21-5. Accordingly, at an arbitrary time point after T29, the cell residual capacities of the three battery cells 21-4~21-6 may be all equalized and reach 2.9 kAh. That is, the module residual capacity of the second battery module 20-2 may be 8.7 kAh.

The third slave BMS 100-3 may perform selective cell balancing of the three battery cells 21-7~21-9 by controlling the wired balancing unit 140 according to the cell balancing command of the third RF signal 703. For at least some time between time points T32 and T33, the third slave BMS 100-3 may discharge at least one of the three battery cells 21-7~21-9 by controlling the balancing switch SW of the wired balancing unit 140.

For example, the third slave BMS 100-3 may turn on the balancing switch SW connected between two ends of the battery cell 21-8 to reduce the cell residual capacity of the battery cell 21-8 by 0.1 kAh, and turn off the balancing switch SW connected between two ends of each of the remaining battery cells 21-7, 21-9. In this instance, the balancing switch SW connected between two ends of the battery cell 21-8 may be turned on for the wired balancing time determined for the battery cell 21-8. Accordingly, at an arbitrary time point after the time point T32, the cell residual capacities of the three battery cells 21-7~21-9 may be all equalized and reach 2.9 kAh. That is, the module residual capacity of the third battery module 20-3 may be 8.7 kAh.

Meanwhile, although the embodiments describe that the module balancing operation is performed earlier than the cell balancing operation with reference to FIGS. 5 to 8, the scope of the present disclosure is not limited thereto. That is, the wireless battery management system 30 may perform the cell balancing operation first and then perform module balancing.

For example, in the state of FIG. 7, when the cell balancing operation is performed first, the residual capacities of all the battery cells 21-1~21-3 of the first battery module 20-1 are 3.0 kAh, the residual capacities of all the battery cells 21-4~21-6 of the second battery module 20-2 are 2.9 kAh, and the residual capacities of all the battery cells 21-7~21-9 of the third battery module 20-3 are 3.1 kAh. It is because the cell balancing operation is performed by balancing all the other battery cells 21 based on the minimum cell residual capacity of each battery module 20. Subsequently, when the module balancing operation is performed, the residual capacities of all the battery cells 21-1~21-3 of the first battery module 20-1 are reduced by 0.1 kAh respectively, and the residual capacities of all the battery cells 21-7~21-9 of the third battery module 20-3 are reduced by 0.2 kAh respectively. Accordingly, it is possible to remove not only a difference in module residual capacity between all the battery modules 20-1~20-3 but also a difference in cell residual capacity between all the battery cells 21-1~21-9.

The embodiments of the present disclosure described hereinabove are not implemented only through the apparatus and method, and may be implemented through programs that realize functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. A wireless battery management system comprising:
    a master battery management system (BMS) configured to transmit a first radio frequency (RF) signal including a state detection command through a first wireless channel; and
    a plurality of slave BMSs coupled to a plurality of battery modules in one-to-one correspondence, wherein each of the plurality of slave BMSs is configured to detect state information of the battery module to which the slave BMS is coupled in response to the first RF signal, and transmit a second RF signal indicating the state information of the battery module through the first wireless channel,
    wherein the master BMS is configured to determine a wireless balancing time for each of the plurality of battery modules based on the second RF signal, and transmit a third RF signal including a module balancing command indicating the wireless balancing time to the plurality of slave BMSs through the first wireless channel,
    wherein each of the plurality of slave BMSs is configured to transmit a fourth RF signal through a second wireless channel during balancing of the plurality of battery modules using electrical energy of the battery module to which the corresponding slave BMS is coupled according to the module balancing command included in the third RF signal, and
    wherein the master BMS is configured to calculate a capacity stored in each of the plurality of battery modules based on the second RF signal, and determine the wireless balancing time for each of the plurality of battery modules based on the module residual capacity of each of the plurality of battery modules.

2. The wireless battery management system according to claim 1, wherein the first wireless channel has a preset first frequency range, and
    wherein the second wireless channel has a preset second frequency range that is separated from the first frequency range.

3. The wireless battery management system according to claim 1, wherein the master BMS is configured to set the module residual capacity of one of the plurality of battery modules as a first target residual capacity, and determine the wireless balancing time for each of the plurality of battery modules based on a difference between the first target residual capacity and each of the other module residual capacities.

4. The wireless battery management system according to claim 1, wherein the state information of the battery module includes state information of each battery cell included in the battery module, and
    wherein the master BMS is configured to calculate a cell residual capacity of each battery cell included in each of the plurality of battery modules based on the second RF signal, and determine the wireless balancing time for each of the plurality of battery modules based on the cell residual capacity of each battery cell included in each of the plurality of battery modules.

5. The wireless battery management system according to claim 4,
    wherein each battery module of the plurality of battery modules has a cell having a minimum cell residual capacity,
    wherein the master BMS is configured to determine a smallest cell residual capacity of the minimum cell residual capacities of the plurality of battery modules as a second target residual capacity, and determine the wireless balancing time for each of the plurality of battery modules not having the smallest cell residual capacity further based on a difference between the second target residual capacity and the minimum cell residual capacity of the battery module.

6. The wireless battery management system according to claim 5, wherein, for each battery module, the master BMS is configured to determine a wired balancing time for each battery cell included in the battery module based on a difference between the cell residual capacity and the minimum cell residual capacity of the battery module, and
    wherein the third RF-signal further includes a cell balancing command indicating the wired balancing time.

7. The wireless battery management system according to claim 6, wherein each of the plurality of slave BMSs includes a wired balancing unit electrically connected to two ends of each battery cell included in the battery module to which the slave BMS is coupled, and
    each of the plurality of slave BMSs is configured to balance the cell residual capacity of each battery cell included in the battery module to which the corresponding slave BMS is coupled by controlling the wired balancing unit according to the cell balancing command included in the third RF signal.

8. A battery pack comprising:
    the wireless battery management system according to claim 1; and
    the plurality of battery modules.

* * * * *